United States Patent [19]
Allemandou et al.

[11] 4,060,775
[45] Nov. 29, 1977

[54] ELECTROMECHANICAL BAND-PASS FILTERS

[75] Inventors: Philippe Marie Allemandou, Ablon; Didier Marcel Beaudet, Saint-Maur-Des-Fosses, both of France

[73] Assignee: Societe Anonyme de Telecommunications, Paris, France

[21] Appl. No.: 707,193

[22] Filed: July 21, 1976

[30] Foreign Application Priority Data

Aug. 4, 1975 France .............................. 75.24217

[51] Int. Cl.² ........................ H03H 9/02; H03H 9/26; H03H 9/24
[52] U.S. Cl. ..................................... 333/71; 310/321; 333/72
[58] Field of Search ............... 333/71, 70 S, 72, 30 M; 310/26, 8.2, 8.3, 8.4, 8.5, 8.7; 331/116 R, 116 M; 330/174, 5.5

[56] References Cited
U.S. PATENT DOCUMENTS 2,647,948  8/1953  Roberts et al. ........................ 333/71

Primary Examiner—Alfred E. Smith
Assistant Examiner—Marvin Nussbaum
Attorney, Agent, or Firm—Marmaduke A. Hobbs

[57] ABSTRACT

A band-pass electromechanical filter, comprising an input electromechanical transducer, an output electromechanical transducer and a mechanical filter disposed therebetween, said filter having, alternately disposed, $p$ resonators and $(p - 1)$ coupling pins, resonating all in the longitudinal mode, wherein the coupling pins have identical diameters and lengths varied according to their respective position within said mechanical filter, said length being maximum in the middle of the filter and progressively decreasing towards the ends thereof.

3 Claims, 9 Drawing Figures

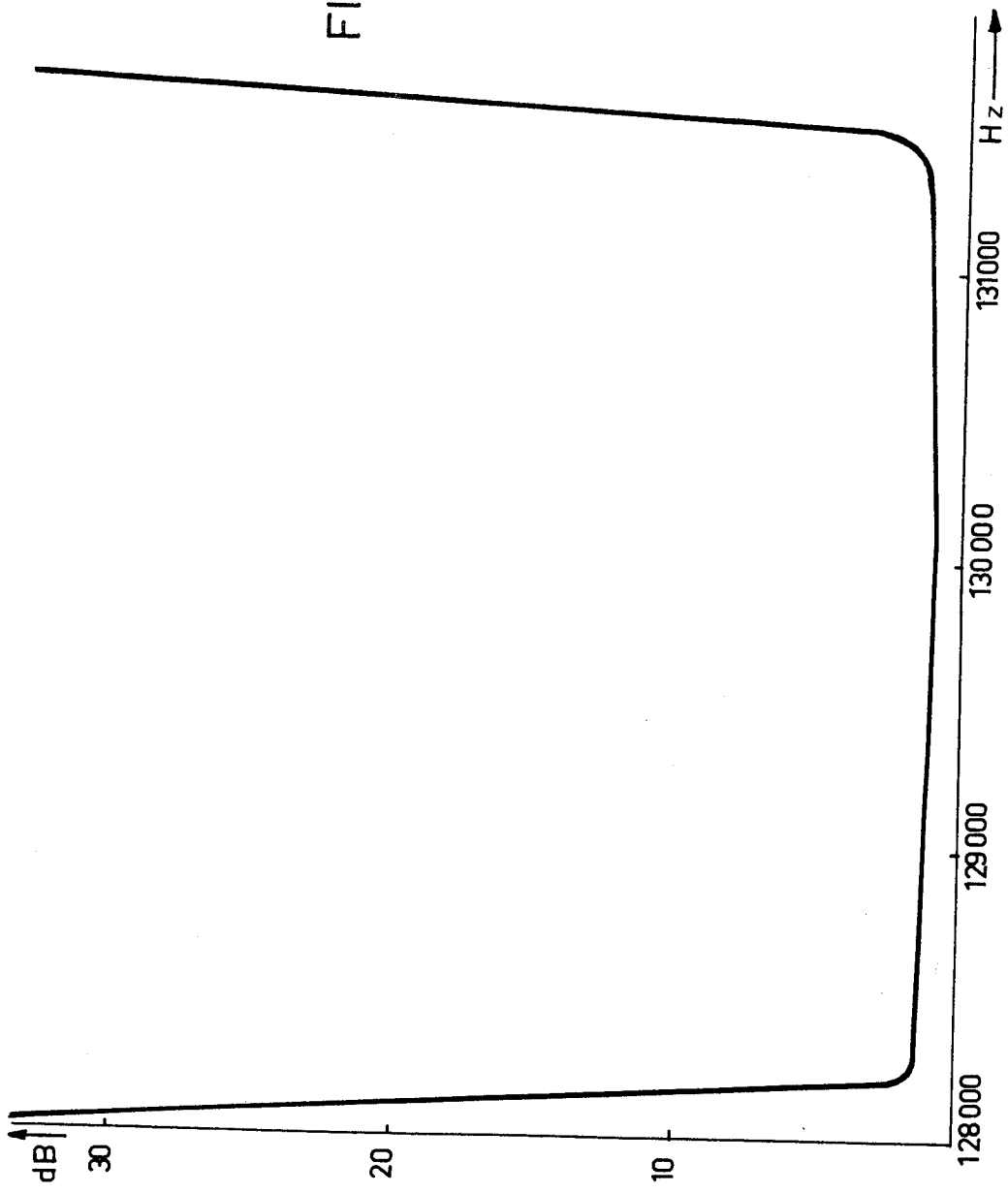

ELECTROMECHANICAL BAND-PASS FILTERS

The present invention is related to electromechanical band-pass filters vibrating in the longitudinal mode.

Electromechanical filters are known to comprise three parts, namely a mechanical filter between two electro-mechanical transducers. Electromechanical transducers, which serve to convert alternative currents into mechanical vibrations, and vice-versa, are not within the scope of the invention which is concerned with the vibrating system, i.e., the mechanical filter.

A mechanical filter includes a plurality of resonators connected with each other by coupling elements in such manner that resonators and coupling elements vibrate or resonate in the longitudinal direction thereof.

A conventional mechanical filter has cylindrical resonators and coupling elements disposed alternately along one single axis. In such an arrangement, resonators resonate as half-wave lines for the central frequency Fo of the pass-band of the filter, and coupling elements resonate as quarter-wave lines for frequency Fo. These known mechanical filters are disadvantageous in that they are very long and cumbersome.

In order to overcome this drawback of the prior art mechanical filters there has been suggested, e.g., in U.S. Pat. No. 3,028,564 to Tanaka et al. a multi-section filter comprising two sections of resonators arranged in parallel relationship and connected by coupling pins with the two sections also disposed in parallel relationship.

There has been further suggested, for instance in French Pat. No. 72 08243, in order to improve the known filters of the above-mentioned type, a filter having two arrays of resonators connected by cylindrical coupling pins with angles and/or cross-sections varied with respect to the position thereof.

A mechanical filter of this type is of greater compactness owing to the "folded" arrangement employed. It is difficult to manufacture, however, both in provision of the angles between the coupling pin axes and the resonator axes and in practical achievement of the welding, generally electrical, for securing to resonators coupling pins of variable diameters. In the latter case, the thrusting force of the welding machine electrode and the power amount of the welding pulse is to be adjusted to the diameter of each coupling pin to be welded.

The object of the present invention is to obviate the above-mentioned defects of the known filters without losing the advantage of greater compactness.

To that purpose, in the mechanical filter according to the invention, the coupling pins have identical diameters and lengths varied according to their respective position within said mechanical filter, said length being maximum in the middle of the filter and progressively decreasing towards the ends thereof.

In a practical embodiment, the resonators are arranged into two sections in parallel relationship in such manner that the axes of the resonators of one section are parallel to, and interlaced with, the axes of the resonators of the other section.

Owing to the variation of the coupling pin length according to the position within the filter, the filter is not of rectangular form, seen from above, but rather of generally mono- or biconvex form.

The reason therefor is that, as recited above, the coupling pins which connect the resonators located at the middle of the filter are the longest ones, whilst the coupling pins which connect the resonators located at the ends of the filter are the shortest ones. The two sections of resonators are thus disposed in parallel relationship and in such a way that for at least one section, or for both sections, the line joining the middles of the resonators is substantially a circle arc.

The design of a band-pass filter having impedance inverters, which is the case in conventional mechanical filters where coupling pins resonating as quarter-wave lines, function as impedance inverters, starts out by specifying a transfer function corresponding to a desired pattern. Once this design is carried out, it is possible from analogy to determine the equivalent filter the elements of which are distributed element lines and then still from analogy to determine the corresponding mechanical filter.

It is thus possible for instance, to design a discrete element band-pass filter from a low-pass Tchebyscheff filter.

Such a filter comprises resonant circuits connected in series and in parallel. By using impedance inverters there is obtained a band-pass filter structure having series LC circuits, all identical, connected through impedance inverters $K_i$. The normalized values $L$, $C$ and $K_i$ can be derived from the normalized element values $g_i$ of the corresponding low-pass filter by use of the following equations:

$$K_i = \frac{g_1}{\sqrt{g_i \cdot g_{i+1}}} \text{ and } C = \frac{1}{L} = \frac{1}{ag_1}$$

where $$a = \frac{\sqrt{F_1 F_2}}{F_2 - F_1},$$

$F_1$ and $F_2$ being the cut-off frequencies of the band-pass filter.

Element values $g_i$ can be found in the book entitled "Microwave filters, impedance-matching networks and coupling structures," page 102, by MATTHAEI, YOUNG and JONES, published by McGraw Hill, New York, 1964.

In the case of a 13-element filter having a ripple of 4 mB, the element values $g_i$ are as follows

| | | | |
|---|---|---|---|
| $g_1$ = | 1.397 | $g_7$ = | 2.427 |
| $g_2$ = | 1.405 | $g_8$ = | 1.575 |
| $g_3$ = | 2.332 | $g_9$ = | 2.413 |
| $g_4$ = | 1.553 | $g_{10}$ = | 1.553 |
| $g_5$ = | 2.413 | $g_{11}$ = | 2.332 |
| $g_6$ = | 1.575 | $g_{12}$ = | 1.405 |
| | | $g_{13}$ = | 1.397 | and the derived values for $K_i$ read as follows:

| | | | |
|---|---|---|---|
| $K_1$ = | 0.997 | $K_7$ = | 0.714 |
| $K_2$ = | 0.772 | $K_8$ = | 0.716 |
| $K_3$ = | 0.734 | $K_9$ = | 0.721 |
| $K_4$ = | 0.721 | $K_{10}$ = | 0.734 |
| $K_5$ = | 0.716 | $K_{11}$ = | 0.772 |
| $K_6$ = | 0.714 | $K_{12}$ = | 0.997 |

It is known that a short-circuited half-wave line is equivalent in the vicinity of its resonant frequency to a series resonant circuit. Likewise a quarter-wave line, in the vicinity of its resonant frequency, functions as an impedance inverter.

A band-pass filter can therefore be designed by replacing LC circuits by half-wave lines of impedance $$Z_L = \frac{2}{\pi}\sqrt{\frac{L}{C}}$$

and by replacing impedance inverters by quarter-wave lines of impedance $K_i$.

When using mechanical lines resonating in the longitudinal mode as equivalents to electrical lines, the relations are:

$$Z_m = S\sqrt{\rho E} \text{ and } V_o = \sqrt{\frac{E}{\rho}}$$

thus $Z_M = S\rho V_o$
where $Z_M$ is the mechanical line impedance, $S$ the mechanical line cross-section area, $\rho$ is the density of the material of said line, $E$ is the Young's modulus of this material and $V_o$ is the wave propagation velocity in the longitudinal mode.

There are used for construction mechanical filters materials having highly heat-stable characteristics, such as the materials marketed under the trademarks ELINVAR, DURINDAL D, DURINDAL B, NISPAN C or THERMELAST. For instance, in the case of ELINVAR, $$\rho = 8.10^3 \text{ kg/m}^3 \text{ and } V_o = 5.10^3 \text{ m/s}$$

According to the prior art, the construction of a band-pass mechanical filter for $$F_0 = \sqrt{F_1 F_2} = 129\,850 \text{ Hz,}$$

with a pass-band $F_2 - F_1 = \Delta F = 3300$ Hz, requires, for example in the case of a 13-element filter, 13 resonators or half-wave lines constituted by cylinders of diameter $\phi_1 = 4.5$ mm and of length $$1 = \frac{V_o}{2F_o},$$

and 12 coupling elements or quarter-wave lines constituted by cylinders of the same material, having diameters $\phi_c$ such that $$\frac{\phi_c^2}{\phi_1^2} = \frac{K_i}{Z_L}$$

The diameters of said coupling elements may for example take the following values

| | | | |
|---|---|---|---|
| $\phi_1$ = 0.759 mm | | $\phi_7$ = 0.643 mm |
| $\phi_2$ = 0.668 mm | | $\phi_8$ = 0.644 mm |
| $\phi_3$ = 0.651 mm | | $\phi_9$ = 0.646 mm |
| $\phi_4$ = 0.646 mm | | $\phi_{10}$ = 0.651 mm |
| $\phi_5$ = 0.644 mm | | $\phi_{11}$ = 0.668 mm |
| $\phi_6$ = 0.643 mm | | $\phi_{12}$ = 0.759 mm |

The mechanical filter of the prior art thus designed comprises resonators having same diameters and half-wave lengths, and coupling elements having different diameters and quarter-wave lengths. The manufacture of such a filter by electrical welding is troublesome owing to the different diameters of the coupling elements.

The object of the invention is to simplify the manufacture process by providing coupling elements of same diameters. To that purpose, the coupling elements of the mechanical filter of the invention have different lengths; they are not quarter-wave lines but nth-wave lines.

FIG. 7 is a curve showing, as an example, the characteristics of an electromechanical filter having a structure according to the present invention;

Figure 1:
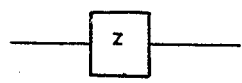
FIG. 1 is a diagram of a quarter wave line of impedance $z$.
Figure 2:
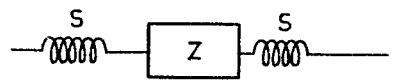
FIG. 2 is a diagram of the nth-wave line of impedance $Z$.

It will now be demonstrated that a quarter-wave line may be replaced by an inductance, an nth-wave line and another inductance. The quarter-wave line of impedance $z$ shown in FIG. 1 is thus equivalent to the nth-wave line of impedance $Z$ associated with the two inductances $S$ shown in FIG. 2. This equivalence may be expressed by the following matrix equation, where $\Omega = F/F_O$ $$\begin{pmatrix} \cos\frac{\pi\Omega}{2} & jz\sin\frac{\pi\Omega}{2} \\ \frac{j}{z}\sin\frac{\pi\Omega}{2} & \cos\frac{\pi\Omega}{2} \end{pmatrix} =$$

$$\begin{pmatrix} 1 & jS\Omega \\ 0 & 1 \end{pmatrix}\begin{pmatrix} \cos 2\pi n\Omega & jZ\sin 2\pi n\Omega \\ \frac{j}{Z}\sin 2\pi n\Omega & \cos 2\pi n\Omega \end{pmatrix}\begin{pmatrix} 1 & jS\Omega \\ 0 & 1 \end{pmatrix}$$

In this equation, $n$ stands for the wave fraction according to which the line of impedance $z$ resonates.

The above equation leads to:

$$\cos 2\pi n\Omega - \frac{S\Omega}{Z}\sin 2\pi n\Omega = \cos\frac{\pi\Omega}{2}$$

$$\frac{1}{Z}\sin 2\pi n\Omega = \frac{1}{z}\sin\frac{\pi\Omega}{2}$$

$$2S\Omega\cos 2\pi n\Omega + Z\sin 2\pi n\Omega - \frac{S^2\Omega^2}{Z}\sin 2\pi n\Omega =$$

$$Z\sin\frac{\pi\Omega}{2}$$

In the vicinity of $\Omega = 1$, i.e., for $F \to F_O$, we obtain:
$S = z\cos 2\pi n\Omega$
$Z = z\sin 2\pi n\Omega$
with $Z$ smaller than $z$.

Figure 3:
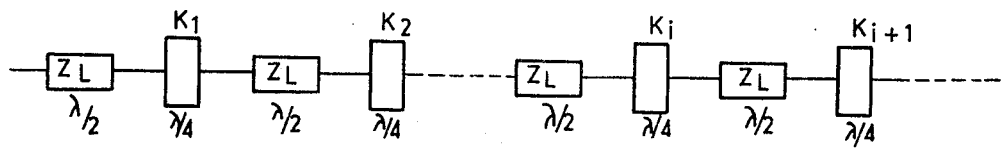
FIG. 3 is a diagram of a known electromechanical filter.
Figure 4:
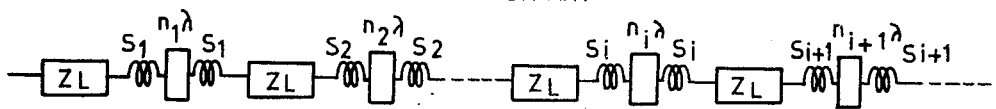
FIG. 4 is a diagram of a group inductance-nth wave line-inductance.

The diagram of a known electromechanical filter as can be seen in FIG. 3, comprising a plurality of half-wave lines of impedance $Z_L$ alternated with a plurality of quarter-wave lines of impedance $K_i$, can thus be replaced by the diagram of FIG. 4, where each quarter-wave line has been replaced by the group inductance - nth-wave line-inductance. From the forgoing relations, $$n = \frac{1}{2\pi} \text{ arc sin } \frac{Z}{z}$$

When choosing as $Z$ value the smallest $K_i$ value i.e., $K_6$ or $K_7 = 0.714$, with the above-mentioned values, we find $$n_i = \frac{1}{2\pi} \text{ arc sin } \frac{0.714}{K_i}$$

and $$S_i = K_i \cos 2\pi n_i$$

This enables the following $n_i$ and $S_i$ values to be designed in view of the construction of a filter according to the invention.

| | | | | | |
|---|---|---|---|---|---|
| $n_1$ | = | 0.127 | $S_1$ | = | 0.695 |
| $n_2$ | = | 0.188 | $S_2$ | = | 0.291 |
| $n_3$ | = | 0.213 | $S_3$ | = | 0.169 |
| $n_4$ | = | 0.227 | $S_4$ | = | 0.101 |
| $n_5$ | = | 0.238 | $S_5$ | = | 0.053 |
| $n_6$ | = | 0.25 | $S_6$ | = | 0 |
| $n_7$ | = | 0.25 | $S_7$ | = | 0 |
| $n_8$ | = | 0.238 | $S_8$ | = | 0.053 |
| $n_9$ | = | 0.227 | $S_9$ | = | 0.101 |
| $n_{10}$ | = | 0.213 | $S_{10}$ | = | 0.169 |
| $n_{11}$ | = | 0.188 | $S_{11}$ | = | 0.291 |
| $n_{12}$ | = | 0.127 | $S_{12}$ | = | 0.695 |

It should be noted that in the described embodiment, the two middle coupling pins are quarter-wave lines, since $n_6 = n_7 = 0.25$, and therefore $S_6 = S_7 = 0$.

Figure 5:
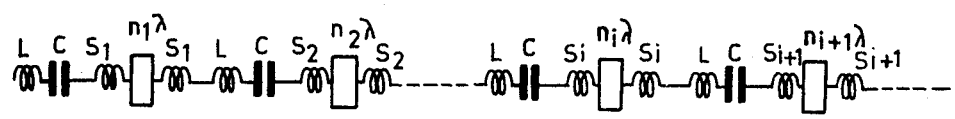
FIG. 5 is a diagram of a series LC circuit.

If now each half-wave line of the diagram of FIG. 4 is replaced by the equivalent thereof, i.e., a series LC circuit, there will be obtained the diagram shown in FIG. 5.

Figure 6:
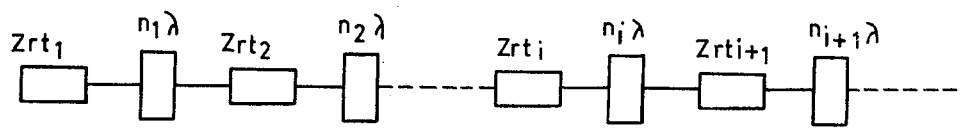
FIG. 6 is a diagram of a half-wave line $Z_{ni}$ having a different tuning frequency of impedance.

It is apparent from this diagram that two $n$th-wave lines such as $n_1\lambda$ and $n_2\lambda$ have therebetween a capacitance and an inductance resulting from the summation of several inductances. The diagram of FIG. 5 can thus be converted into the diagram of FIG. 6, where each group capacitance-sum of inductances is replaced by a new half-wave line $Z_{ri}$ having a different tuning frequency, of impedance $$Z_{ri} = \sqrt{\frac{L + S_i + S_{i+1}}{C}}$$

The tuning frequency of such half-wave lines is $$F_i = \frac{1}{2\pi \sqrt{C(L + S_i + S_{i+1})}}$$

and the length of the respective line is $$l_i = \frac{1}{2} \cdot \frac{F_o}{F_i} \cdot \lambda_o \text{ where } \lambda_o = \frac{V_o}{F_o}$$

These equations enable the parameters of a filter according to the invention to be designed. The following valus will be obtained in the described embodiment ($m_i$ stands for the expression $\frac{1}{2}(F_o/F_i)$).

| | | | | | |
|---|---|---|---|---|---|
| $Z_{r1}$ | = | 35.22 | $m_1$ | = | 0.50315 |
| $Z_{r2}$ | = | 35.31 | $m_2$ | = | 0.50447 |
| $Z_{r3}$ | = | 35.15 | $m_3$ | = | 0.50209 |
| $Z_{r4}$ | = | 35.08 | $m_4$ | = | 0.50123 |

-continued

| | | | | | |
|---|---|---|---|---|---|
| $Z_{r5}$ | = | 35.05 | $m_5$ | = | 0.50070 |
| $Z_{r6}$ | = | 35.02 | $m_6$ | = | 0.50024 |
| $Z_{r7}$ | = | 35 | $m_7$ | = | 0.5 |
| $Z_{r8}$ | = | 35.02 | $m_8$ | = | 0.50024 |
| $Z_{r9}$ | = | 35.05 | $m_9$ | = | 0.50070 |
| $Z_{r10}$ | = | 35.08 | $m_{10}$ | = | 0.50123 |
| $Z_{r11}$ | = | 35.15 | $m_{11}$ | = | 0.50209 |
| $Z_{r12}$ | = | 35.31 | $m_{12}$ | = | 0.50447 |
| $Z_{r13}$ | = | 35.22 | $m_{13}$ | = | 0.50315 |

A filter so constructed has proved quite satisfactory. The curve of FIG. 7 shows as an example the characteristics of an electro-mechanical filter having the structure according to the invention.

When considering the $Z_{ri}$ values listed in the above table, it will be noted that, with a precision less than 1%, the following relation may be written:

$$Z_{r1} = Z_{r2} = Z_{ri}$$

This approximation has been justified by experience, so that, for constructing electromechanical filters according to the invention, resonators of same impedance are conveniently used.

Figure 8:
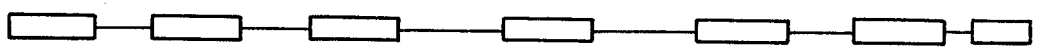
FIG. 8 illustrates a filter of elongated form.

FIG. 8 shows a filter of elongated form.

Figure 9:
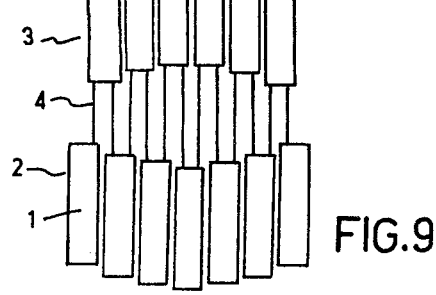
FIG. 9 shows a filter of folded form having the structure of the invention.

FIG. 9 shows a filter of folded form having the structure of the invention.

On the latter figure, resonators 1 are arranged into two arrays 2 and 3, array 2 comprising the odd-order resonators and array 3 comprising the even-order resonators. Resonators 1 have all the same diameter and are connected two by two by coupling pins such as 4. According to the invention, coupling pins have the same diameter but differ in length, which provides the characteristic appearance seen in FIG. 9.

The mechanical filters according to the invention are mainly intended to be employed in telephony or broadcasting electronic circuits.

What we claim is:

1. A band-pass electromechanical filter, comprising an input electromechanical transducer, an output electromechanical transducer and a mechanical filter disposed therebetween, said filter having $p$ resonators and $(p-1)$ coupling pins, resonating all in the longitudinal mode, each coupling pin connecting two adjacent resonators, wherein the coupling pins have identical diameters and lengths varied according to their respective position within said mechanical filter, the length value being minimum at the end coupling pins and progressively increasing to a maximum at the half-way coupling pins.

2. A filter according to claim 1, wherein the resonators are arranged in parallel relationship and divided into two sections of which the first one comprises the even-order resonators and the second one comprises the odd-order resonators, the axes of the even-order resonators being arranged intermediate the axes of the odd-order resonators, — the axes of the coupling pins being arranged in parallel relationship to the axes of the resonators.

3. A filter according to claim 1, wherein each coupling pin is an $n$th-wave line for the central frequency $F_o$ of the filter, $n$ being $\frac{1}{4}$ for the coupling pins of maximum length, and each resonator is an $m$th-wave line for said frequency $F_o$, $m$ being at least $\frac{1}{2}$, said $n$th-wave lines constituting the coupling pins being defined by replacing a conventional quarter-wave line of normalized impedance $K_i$ by a group inductance $S_i$ — $n$th-wave line-inductance $S_i$, and said $m$th-wave lines constituting the resonators being defined by adding to a conventional half-wave line, equivalent to a resonant circuit LC and having an impedance $$Z_L = \sqrt{\frac{L}{C}},$$

said inductances $S_i$ and $S_{i+1}$ relating to the adjacent coupling pins.

* * * * *